(12) United States Patent
Shinogi et al.

(10) Patent No.: US 6,424,051 B1
(45) Date of Patent: Jul. 23, 2002

(54) SEMICONDUCTOR DEVICE

(75) Inventors: Hiroyuki Shinogi; Nobuyuki Takai; Ryoji Tokushige; Katsuhiko Kitagawa, all of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/500,271

(22) Filed: Feb. 8, 2000

(30) Foreign Application Priority Data

Feb. 9, 1999 (JP) .......................................... 11-031389

(51) Int. Cl.[7] .................................................. H01L 23/28
(52) U.S. Cl. ..................................... 257/787; 257/758
(58) Field of Search ................................ 257/787, 758, 257/678

(56) References Cited

U.S. PATENT DOCUMENTS 5,593,925 A * 1/1997 Yamaha
5,763,936 A * 6/1998 Yamaha et al.

FOREIGN PATENT DOCUMENTS

JP  A-09-64049  3/1997

* cited by examiner

Primary Examiner—Sheila V. Clark
(74) Attorney, Agent, or Firm—Fish & Richardson P.C.

(57) ABSTRACT

To improve the moisture resistance of a chip size package, a seal ring 4 is made up of tungsten plugs and metal electrodes 11 and 12. Further, a spacer is formed on both or either of a first flank 13 and a second flank 14. The spacer can be formed on all interlayer insulating films extended to a dicing line part 3, whereby multiple seal rings can be provided.

19 Claims, 2 Drawing Sheets

SEMICONDUCTOR DEVICE

BACKGROUND OF THE INVENTION

1. Field of the Invention

This invention relates to a semiconductor device having a chip size package (CSP) structure and in particular to a chip size package improved in moisture resistance.

2. Description of the Related Art

To manufacture semiconductor devices, elements are built one after another in a wafer to form IC circuits each having a predetermined function, as well known. In two dimensions, IC circuit formation parts where the IC circuits are formed are placed like a matrix, dicing line parts are provided like a lattice surrounding the IC circuit formation parts, and the IC circuit formation parts are diced along the dicing line parts to form separate semiconductor devices (semiconductor chips) Then, often each semiconductor chip is mounted on connection pins of a lead frame, a film carrier, etc., and is sealed with a resin.

However, in recent years, attention has been focused on a method wherein connection pins are formed and sealing is executed before dicing for miniaturization and simplifying packaging. A chip size package (CSP) is available, for example, as described in JP-A-9-64049. FIG. 2 gives an outline of a chip size package 50 disclosed in JP-A-9-64049. A wafer 51 is formed with a desired element area, then is covered on a surface with a passivation film 52. An opening is made for exposing each metal electrode 53 (for example, a bonding pad) on the top layer and a rearrangement-rewiring layer 54 is formed by a Cu plating method so as to come in contact with the metal electrode 53 via the opening.

A metal post 55 is formed on the surface of the rearrangement-rewiring layer 54, the full face is coated with a seal resin 56, and the metal post 55 exposed from the seal resin 56 is formed with a solder bump or a solder ball 57.

In this state, dicing is performed along dicing line parts 58 to separate the wafer 51 into complete semiconductor chips 50.

However, the interfaces each between interlayer insulating films deposited in the semiconductor device are exposed to the flanks of the dicing lines. The interfaces become entry passages of moisture, causing malfunction of the IC circuit and destruction of the IC circuit.

Particularly, a number of interlayer insulating films such as a first interlayer insulating film, a second interlayer insulating film, a third interlayer insulating film are provided depending on the number of layers of metal wiring and moreover each interlayer insulating film is formed by repeatedly depositing films each consisting of a plurality of layers, such as TEOS films or SOG films, considering distortion and flatness. The interfaces each between the films are exposed to the flanks formed in the dicing line parts, causing moisture resistance to be degraded.

SUMMARY OF THE INVENTION

It is therefore an object of the invention to provide a CSP improved in moisture resistance and high in reliability.

In a first aspect of the invention, a seal ring surrounding an IC circuit formation part formed on the main face of a semiconductor chip is placed between the IC circuit formation part and a dicing line part formed surrounding the IC circuit formation part.

Since a plug for cutting the interface between interlayer insulating films is provided as the seal ring, the passage of moisture is blocked.

In the first aspect, the dicing line part has a first dicing flank (side wall) which is an upper flank of the semiconductor chip covered with a resin and a second dicing flank comprising an exposed lower flank of the semiconductor chip.

If the upper flank reaches a semiconductor substrate, the interface between the interlayer insulating films above the semiconductor substrate is covered with the resin, thus double sealing structure can be made.

That is, the first aspect of the invention is characterized by the fact that in a semiconductor device of a chip size package structure having a size substantially equal to a size of one surface of a semiconductor substrate, the one surface of the semiconductor substrate being covered with a resin, a seal ring surrounding an IC circuit formation part formed on the main face of the semiconductor substrate is placed between the IC circuit formation part and a dicing line part formed surrounding the IC circuit formation part.

According to the configuration, the seal ring is provided on the outer periphery, thus if moisture is entered from the outside, it is blocked by means of the seal ring, making it possible to prevent the internal IC circuit formation part from being degraded.

In second and later aspects of the invention, the following advantages are provided in addition to the above-described advantage:

In a second aspect of the invention, in the semiconductor device, the seal ring may be formed so as to cover the outer peripheral ends of interlayer insulation films of at least two layers.

According to the configuration, since moisture is entered more easily from the edge of the interface, the end face is covered, whereby it is made possible to prevent entry of moisture.

In a third aspect of the invention, in the semiconductor device, the seal ring may be made up of seal grooves formed in the interlayer insulation films of at least two layers and seal material filled in the seal grooves.

In a fourth aspect of the invention, in the semiconductor device, the seal ring may be made up of a plurality of rings arranged in a periphery of the semiconductor substrate.

According to the configuration, moisture is blocked by means of a plurality of rings, so that it is made possible to block moisture perfectly.

In a fifth aspect of the invention, in the semiconductor device, the seal ring may be made up of a first layer ring and a second layer ring deposited on the first layer ring.

According to the configuration, the seal ring is made up of a plurality of layers, whereby it is made possible to form the seal ring at the same step as another functional circuit part; formation is more facilitated.

In a sixth aspect of the invention, in the semiconductor device, a pad formed so as to cover the cross sections of the first layer ring and the second layer ring may be placed between the first layer ring and the second layer ring.

According to the invention, if the seal ring is formed of a plurality of layers, sufficient sealing can also be provided. The pad is projected, whereby the moisture entry passage can be lengthened and it is made possible to better block moisture.

In a seventh aspect of the invention, in the semiconductor device, the first layer ring, the second layer ring, and the pad may be formed of metal material.

In an eighth aspect of the invention, in the semiconductor device, the first layer ring, the second layer ring, and the pad may be formed at the same step as the IC circuit formation part.

According to the configuration, they can be formed without adding a special step; manufacturing is facilitated.

In a ninth aspect of the invention, in the semiconductor device, the seal material may be metal barrier layers formed so as to cover the inner walls of the seal grooves and metal layers filled in the metal barrier layers.

According to the configuration, it is made possible to block moisture more reliably.

In a tenth aspect of the invention, in the semiconductor device, the metal barrier layers may be made of Ti or TiN and the metal layers may be made of tungsten or copper.

In an eleventh aspect of the invention, in the semiconductor device, the seal material may contain a hygroscopic material.

According to the configuration, if moisture is entered from the outside, it is absorbed in the hygroscopic material and it is made possible to prevent moisture from arriving at the internal IC circuit part.

In a twelfth aspect of the invention, in the semiconductor device, the seal material may be an insulating material.

In a thirteenth aspect of the invention, in the semiconductor device, the seal material may be a silicon nitride film formed so as to cover the inner walls of the seal grooves and a silicon oxide film filled in the seal grooves coated with the silicon nitride film.

In a fourteenth aspect of the invention, in the semiconductor device, the dicing line part may have a first dicing flank covering an upper flank of a semiconductor chip with the resin and a second dicing flank to which a lower flank of the semiconductor chip is exposed.

According to the configuration, the outermost periphery is coated with resin and it is made possible to block moisture more reliably.

In a fifteenth aspect of the invention, in the semiconductor device, the interface between the first dicing flank and the second dicing flank may be formed so as to become a predetermined depth position from the surface level of the semiconductor substrate.

In a sixteenth aspect of the invention, the semiconductor device may further include a spacer formed so as to surround said seal ring and cover an end part of an interface between an interlayer insulating film and another layer at the dicing line part.

According to the configuration, moisture is also blocked by the spacer, so that it is blocked more reliably.

In a seventeenth aspect of the invention, in the semiconductor device, the spacer may be placed away from the seal ring.

According to an eighteenth aspect of the invention, there is provided a semiconductor substrate of chip size package structure having a size substantially equal to a size of one surface of a semiconductor substrate, the one surface of the semiconductor substrate being covered with a resin, the chip size package comprising a spacer formed so as to surround an IC circuit formation part formed on the main face of the semiconductor substrate and cover an end part of the interface between an interlayer insulating film and another layer at a dicing line part.

According to the configuration, moisture can be blocked by the spacer, and it is made possible to improve the reliability of the semiconductor device.

In a nineteenth aspect of the invention, in the semiconductor device, the dicing line part may have a first dicing flank covering an upper flank of a semiconductor chip and a second dicing flank to which a lower flank of the semiconductor chip is exposed.

In a twentieth aspect of the invention, in the semiconductor device, the interface between the first dicing flank and the second dicing flank may be formed so as to become a predetermined depth position from the surface level of the semiconductor substrate.

According to the invention, the IC circuit formation part easily affected by moisture is completely covered, so that it is made possible to block moisture more reliably.

DESCRIPTION OF THE PREFERRED EMBODIMENT

Referring now to the accompanying drawing, there is shown a preferred embodiment of the invention. To describe the embodiment, a MOS-type semiconductor is covered, but the invention can also be embodied for BIP-type semiconductor devices and Bi-CMOS-type semiconductor devices.

Figure 1:
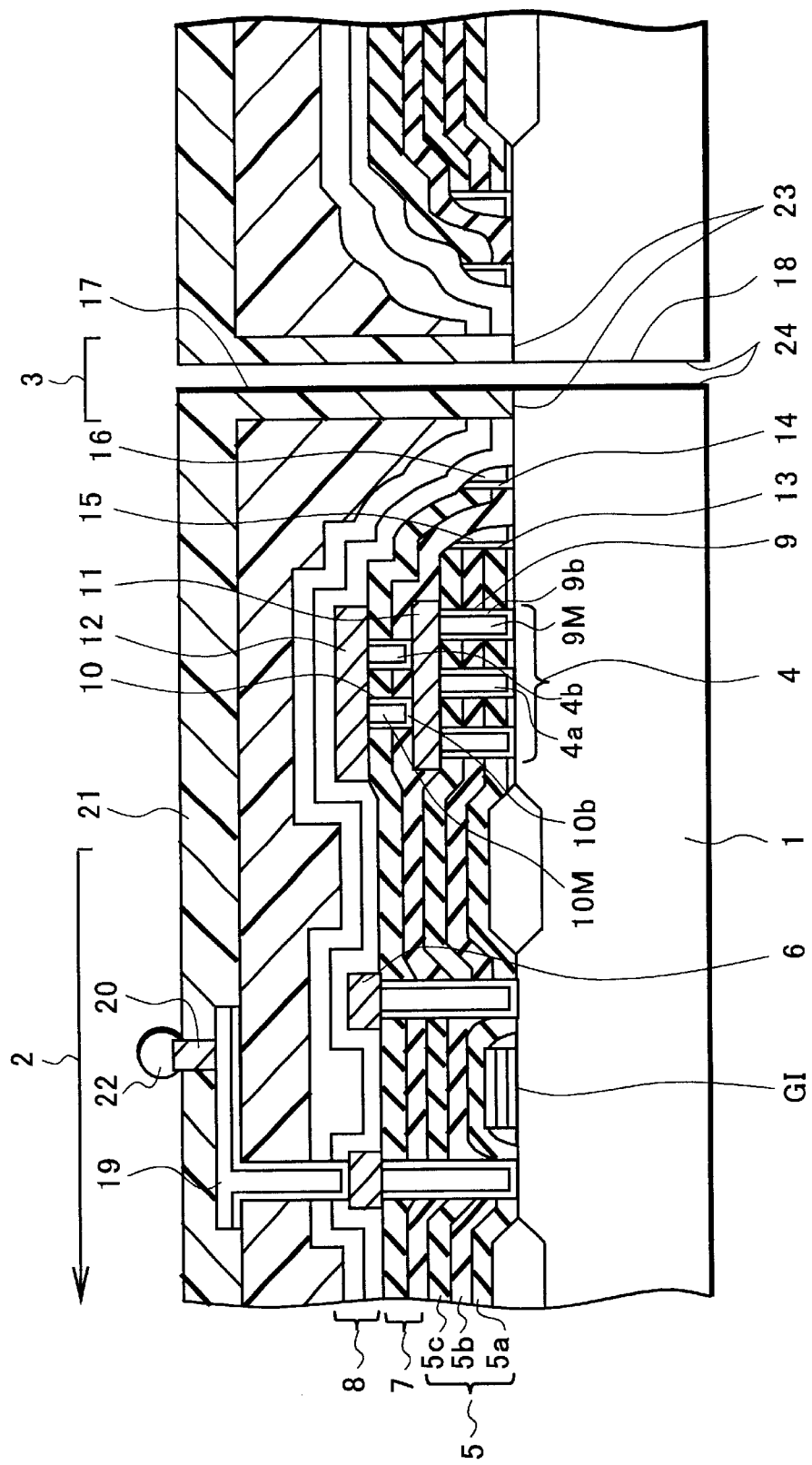
FIG. 1 is a sectional view to show a semiconductor device of the invention.
Figure 2:
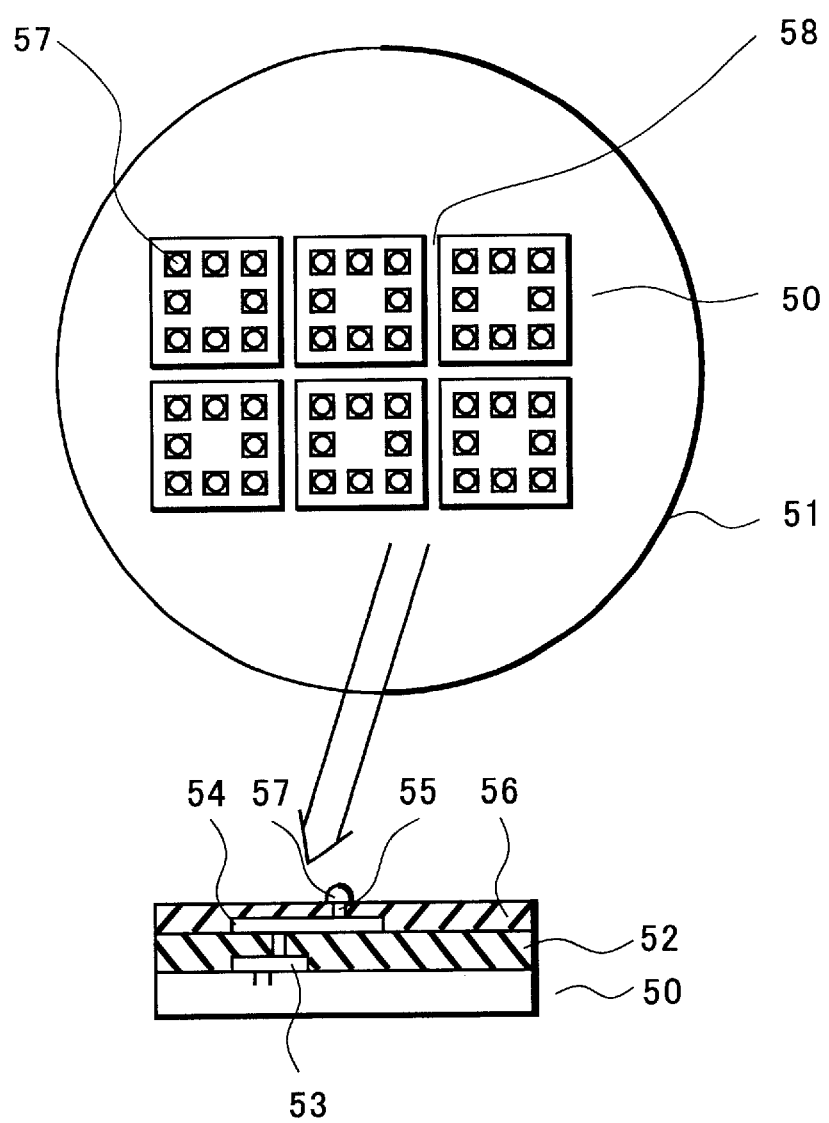
FIG. 2 is a sectional view to show a semiconductor device in a related art.

A semiconductor device shown in FIG. 1 is a semiconductor chip just after a wafer is diced, namely, a semiconductor wafer formed with a large number of elements is cut on dicing line parts 3 and a semiconductor chip 1 comprises a first seal ring 4 disposed between an IC circuit formation part 2 and the dicing line part 3. Since the IC circuit formation part 2 itself of the semiconductor chip 1 consists of two metal layers, the seal ring 4 is of a two-story structure consisting of a first layer seal ring 4a and a second layer seal ring 4b. Therefore, a seal ring of a two-or-more-story structure is possible depending on the number of metal layers. For example, for three metal layers, seal rings of a one-story structure to a three-story structure are possible.

A specific structure of the seal ring 4 will be discussed. For example, in the IC circuit formation part 2, a diffusion region is formed, transistors, diodes, diffused resisters, etc., are built, and an insulting film is formed on the surface of the IC circuit formation part 2 by executing a normal process.

Since MOS is formed with a gate, a gate insulating film Si becomes necessary; generally, an interlayer insulating film 5 of the first layer is formed below metal wiring of the first layer. In FIG. 1, the metal wiring of the first layer is not shown. An interlayer insulating film 7 of the second layer is formed between the layer below metal wiring 6 of the second layer and the metal wiring of the first layer. In FIG. 1, the metal wiring 6 of the second layer is in direct contact with a semiconductor substrate 1; generally, it is in contact with metal wiring of the first layer via a contact hole.

Further, a coat of a passivation film 8 is put on the metal wiring 6 of the second layer because of the two metal layers in FIG. 1. However, for three or more metal layers, a passivation film is formed on the metal wiring of the top layer and an interlayer insulating film is formed between the metal wiring layers below the top layer.

The interlayer insulating films 5, 7, and 8 are extended to the dicing line part 3 or its proximity. The seal ring 4 surrounding the dicing line part 3 is placed between the dicing line part 3 and the IC circuit formation part 2.

In the formation area of the seal ring 4, a plurality of first seal grooves 9 with the interlayer insulating film 5 of the first layer removed (in the figure, three grooves) are made surrounding the IC circuit formation part 2. A plurality of second seal grooves 10 (in the figure, two grooves) are also made in the interlayer insulating film 7 of the second layer. On the seal grooves, a first metal electrode 11 and a second metal electrode 12 are formed so as to provide wiring via contacts.

This means that the metal electrodes also containing the seal grooves may be formed of the same material. However, here, tungsten plugs are used for the IC circuit formation part 2 for interconnection, thus W is embedded in each seal groove 9, 10, forming a metal post 9M, 10M. The metal electrodes 11 and 12 consist essentially of Al.

In particular, metals as barrier metals 9b and 10b are deposited on the full face also containing the seal grooves in the order of Ti and TiN. A coat of Ti is put about 300–500 A and a coat of TiN is put about 1000–2000 A and further the full face is coated with W about 5000–8000 A. The W is etched back to form tungsten plugs. To form the metal electrode, TiN, Ti, and AlCu are deposited about 500–1000 A, about 100–200 A, and about 3000–5000 A from the bottom to the top and are etched in a pattern as shown in the figure.

In the proximity of the dicing line part 3, the interlayer insulating film 5 of the first layer is extended from the IC circuit formation part 2 and an end part (flank) 13 is provided. The interlayer insulating film 7 of the second layer is also extended from the IC circuit formation part 2 and an end part (flank) 14 is provided.

The interlayer insulating film 5 of the first layer consists of three layers in the figure; specifically, a gate insulating film 5i is formed on the surface, an $SiO_2$ film 5a is deposited on the gate insulating film 5i, a BPSG film 5b is deposited about 2000–4000 A on the $SiO_2$ film 5a, and a TEOS film 5c is deposited about 8000–10000 A on the BPSG film 5b. However, the interlayer insulating films 5,7 may be a one-layer insulating film or may consist of three or more deposited layers. The interlayer insulating film 7 of the second layer consists of two layers in the figure; specifically, a plasma TEOS film about 2000 A, an SOG film about 2000 A, a plasma TEOS film about 500–1000 A, an SOG film about 2000 A, and a plasma TEOS film about 2000–3000 A are deposited from the bottom to the top, forming the interlayer insulating film 7.

According to the described configuration, the invention is first characterized by the fact that the seal size package is provided with the seal ring 4, so that the seal ring 4 can block entry of moisture from the dicing line part, whereby moisture resistance can be enhanced drastically. Each of the interlayer insulating films 5 and 7 consists of a plurality of deposited insulating films as described above, and the interface between the interlayer insulating films is extended from the above-described end part. However, the seal grooves 9 and 10 are provided and metal posts 9M and 10M made of metal are embedded in the seal grooves 9 and 10. Thus, if moisture enters the chip from the flank exposed to a dicing line 24 through a dicing groove 23 via a dicing flank 17 or 18, the seal ring 4 can block the moisture.

The invention is second characterized by the fact that a spacer 15, 16 is placed on the first flank 13, the second flank 14.

To form the spacer 15, 16, generally a film is put on the full face, then is etched back. Therefore, here, an insulating film of a silicon oxide film, an $Si_3N_4$ film, a TEOS film, etc., a material consisting mainly of Al, an amorphous silicon film, a monocrystalline silicon film, a polycrystalline silicon film, W, and the like are possible. All are materials that can be etched back.

Like the first seal ring 4 described above, the spacer seals the interface between the interlayer insulating films; here the end face is covered. The point is that the outermost periphery, namely, the first entry passage of moisture is sealed.

The spacer is formed on both end faces, but if the spacer is formed on either end face, the effect of the spacer is produced. Of course, if the number of layers increases, the end face also increases and thus the spacer placement area increases. At least one may be required and one spacer provides sealing.

In FIG. 1, the first seal ring 4, the first spacer 15, and the second spacer 16 form triple sealing. Further, the dicing flank may be covered with a resin, as described later.

The films of up to the passivation film 8 are formed by executing the same manufacturing process as normal IC. For IC, a thin metal line is connected to a metal pad exposed from the passivation film 8 and an opposite end is connected to a lead of a lead frame on which the IC is mounted.

In the embodiment, however, to form the chip size package, further a wiring layer 19 and a metal post 20 are formed, and a solder bump or a solder ball 22 is formed on the metal post 20 exposed from a seal resin 21.

The wiring layer is formed by Cu plating or sputtering, for example. The seal resin 21 is a material that can be made a flat surface over all area. That is, considering the flatness of the wiring layer 19, a fluid resin is applied and is left standing, whereby the surface becomes flat, then curing is executed. The step can be easily accomplished, for example, if the resin is applied by spin on or with a dispenser. It is also possible with SOG.

The metal post 20 is formed in at least one end part of the wiring layer 19. The metal post 20 is made of a material capable of relieving a stress occurring because of the thermal expansion coefficient difference occurring when the semiconductor device is mounted on a printed circuit board. That is, the printed circuit board has a higher expansion rate, the metal post is pulled in the expansion direction. However, if the metal post 20 is high, it can absorb the stress as a bamboo is bent.

On the other hand, dicing is applied to the dicing line part 3 once or twice.

For one dicing, full cutting is applied along the dicing flank 17. This is a normal method for the chip size package.

To execute dicing twice, first dicing of half cutting arriving at the semiconductor substrate 1 is performed. Then, the dicing flank 17 appears. The seal resin 21 is embedded in the dicing groove 23 formed by the half cutting and full cutting is executed narrower than the first dicing groove 23 containing the embedded seal resin 21.

This indicates the outermost seal as described above. That is, the interface between the passivation film 8 and its ground at the edge is sealed with the seal resin in the proximity of the full cut line 24. Although the interface between the passivation film 8 and its ground is exposed to the dicing flank 17 if one full cutting is applied, it is also made possible to seal the interface by executing dicing twice, namely, by executing the first dicing, then covering the interface with the seal resin 21, then executing the second dicing.

For the spacer 15, 16, an opening with the end part 13, 14 as one flank is made at the same time as the seal grooves 9, 10 are formed, and W is embedded in the grooves and the opening and etching back is executed at the same time, whereby the plug and the spacer can be formed at the same time and the process is not increased. Here, it is necessary to make the aperture of the seal groove 9, 10 smaller than a predetermined value to such an extent that it is not removed by etching back. Of course, the step may be executed at the same time as the contact and W are formed in the IC circuit formation part.

In recent years, CSPs (chip size packages) have been developed and have appeared on the market. The CSP has an extremely small resin amount and improvement in moisture resistance is a very important theme.

Particularly, for wafer-type CSPs, ICs are built in a wafer state and a passivation film is put, then a seal resin is placed on the full face, then the wafer is diced and separated into discrete chips. Thus, the interface between the interlayer insulating films described above is exposed onto the flank of each chip. Therefore, the seal ring is positioned as a very important factor. If the configuration of the invention is adopted, multiple seals can be provided and degradation of moisture resistance of the chip can be prevented.

Next, a manufacturing method of the semiconductor device of the invention will be discussed.

First, a semiconductor wafer is provided and by executing usual step, IC circuit formation parts 2 are formed like a matrix and dicing line parts 3 are formed so as to surround the IC circuit formation parts 2. Between each IC circuit formation part 2 and each dicing line part 3, a seal ring 4 is provided so as to surround the IC circuit formation part 2 at a later wiring layer formation step.

Numeral 5 denotes a first interlayer insulating film formed below a metal electrode of the first layer (in the IC circuit formation part, first metal wiring) 11. To form the first interlayer insulating film 5, a gate insulating film 5i is formed on the surface, an $SiO_2$ film 5a is deposited on the gate insulating film 5i, a BPSG film 5b is deposited about 3000 A on the $SiO_2$ film 5a, and a TEOS film 5c is deposited about 8000–10000 A on the BPSG film 5b.

Subsequently, a plurality of seal grooves 9 and 10 are formed in the first interlayer insulating film 5 so as to expose the semiconductor substrate 1 by photolithography, and tungsten is embedded in the seal grooves 9 and 10. The three grooves (the number of the grooves is not limited) are formed like rings and at the same time, an opening with a first flank 13 as a component is made. The opening is formed at the same time as the first seal grooves 9 and thus is formed so as to arrive at the semiconductor substrate 1, but may be made at another step. In this case, the first seal groove 9 may have a shallower depth than that shown in the figure. However, it must have a depth capable of covering at least the top interface with a spacer. To decrease the chip size, only spacer 16 may be formed without forming the seal ring.

Subsequently, tungsten plugs are formed in the first seal groove 9 and a spacer is formed in the first opening and further the metal electrode 11 of the first layer is formed covering all the tungsten plugs.

In fact, before the tungsten plugs are formed, metals as barrier metal 9b are deposited on the full face also containing the seal grooves 9 in the order of Ti and TiN. A coat of Ti is put about 300–500 A and a coat of TiN is put about 1000–2000 A and further a metal post 9M made of W is formed about 8000 A thick on the full face. The W is etched back to form the tungsten plug, and a spacer 15 made of W is formed on the flank 13 of the first opening. Extra barrier metal other than the area of the first metal electrode 11 or the spacer area is removed.

To form the metal electrode 11, TiN, Ti, and AlCu are deposited about 500–1000 A, about 100–300 A, and about 3000–5000 A from the bottom to the top and are etched in a pattern as shown in the figure by photolithography. Three tungsten plugs of the first layer are formed as rings surrounding the IC circuit formation part 2, and the first metal electrode 11 is formed as a wide ring for covering all the rings.

The first tungsten plug is formed at the same time as wiring is formed in the IC circuit formation part 2. That is, in the same configuration as the first tungsten plug, metal plug is also formed in the IC circuit formation part 2 so as to come in contact with a source region and a drain region of a transistor and the first metal electrode is also formed as wiring at the same time in the IC circuit formation part 2 and is in electric contact with the tungsten plug formed in the IC circuit formation part 2.

Here, as described above, if the first seal grooves 9 are not formed, the spacer is not formed either, of course.

Subsequently, an interlayer insulating film 7 of the second layer is formed from the IC circuit formation part 2 to the dicing line part 3. Here, it is formed so as to cover the full face of the wafer.

The interlayer insulating film 7 of the second layer consists of two layers in the figure; specifically, a plasma TEOS film about 2000 A, an SOG film about 2000 A, a plasma TEOS film about 500–1000 A, an SOG film about 2000 A, and a plasma TEOS film about 2000–3000 A are deposited in order from the bottom to the top, forming the interlayer insulating film 7, as described above.

In the dicing line part 3, the interlayer insulating film 7 of the second layer covers the spacer 15 for sealing the flank of the first interlayer insulating film 5.

Further, a second opening with a flank 14 as one component is made at the same time as the second seal grooves 10 for exposing the metal electrode 11 of the first layer are formed.

Here, the second seal grooves 10 are also formed at the same time as the second opening is made, but etching may be executed at another step. The depth may be to an intermediate point of the second interlayer insulating film 7 or may be a depth where the first interlayer insulating film 5 is removed to an intermediate point, because a seal function can be provided if the depth allows at least the top layer interface to be sealed, as described above.

Subsequently, tungsten is embedded in the second seal grooves 10 and at the same time, the W spacer 16 is formed in the second opening 16.

Here, first, barrier metal consisting of Ti about 300–500 A and TiN about 1000–2000 A from the bottom to the top is formed by sputtering on the full face also containing the second seal grooves 10, and a coat of W about 5000–8000 A is put on the barrier metal by a CVD method, for example.

Subsequently, the above-mentioned W is etched back to form tungsten plugs, and the spacer 16 made of tungsten is formed on the second flank 14.

The spacer 16 of the coat part provides a seal ring for covering the interface exposed to the second flank 14 and preventing entry of moisture.

That is, in the configuration, the IC circuit formation part 2 is first sealed with the seal ring 4 made of the tungsten plugs and then the outside thereof is sealed with the spacers 15 and 16 made of W, providing a triple seal structure.

The tungsten plugs are coated and a metal electrode 12 of the second layer is formed like a ring. To form the metal electrode 12, a layer of AlCu about 6000–8000 A is deposited on a layer of Tin about 200–300 A and patterning is executed like a ring.

Subsequently, a third interlayer insulating film 8 is formed from the IC circuit formation part 2 to the dicing line part 3. A resin 21 is applied so as to flatten the surface.

The metal electrode of the top layer formed in the IC circuit formation part 2 is exposed to the interlayer insulating film 8 and the resin 21, and a rewiring layer 19 of Cu also containing the opening is formed. The rewiring layer 19 of Cu is formed at an end part with a metal post by plating, and the full face is sealed with the resin 21.

A solder ball 22 is formed on the metal post 20 exposed from the resin 21.

Before the full face is sealed with the resin 21, a dicing groove 23 is formed and the resin is also embedded in the dicing groove 23.

Last, the semiconductor wafer is diced along full cut lines 24 to provide separate semiconductor chips. The semiconductor devices of the embodiment of the invention are thus formed.

According to the semiconductor device, the seal ring is provided surrounding the IC circuit formation part and the plug forming a part of the seal ring cuts the interface between the interlayer insulating films, so that the passage of moisture is blocked and degradation of the chip size package can be prevented.

The dicing line part has the first dicing flank covering the upper flank of the semiconductor chip with a resin and the second dicing flank to which the lower flank of the semiconductor chip is exposed, so that the interface between the interlayer insulating films above the semiconductor substrate can be sealed with the resin. Preferably, the first dicing flank, namely, the dicing groove formed by the first dicing is formed so as to arrive at the semiconductor substrate, a part of the surface of the semiconductor substrate, whereby a passage of moisture can be prevented from being formed directly in the element area on the surface of the semiconductor substrate.

In addition to the first ring seal, the spacer for covering the flank of the interlayer insulating films, namely, the interface therebetween is provide, so that double, triple sealing is made possible.

The dicing line part has the first dicing flank covering the upper flank of the semiconductor chip with a resin and the second dicing flank to which the lower flank of the semiconductor chip is exposed, so that the first seal ring, the second seal ring, and the resin can block the passage of moisture in the dicing line part and in the proximity thereof.

Improvement in moisture resistance in the chip size package has been described. The invention is also effective for normal semiconductor devices as well as the CSPs, needless to say. Particularly, for a bear chip, a passivation film is only formed on the surface and moisture resistance involves a problem. However, the reliability of the bear chip can be improved by adopting the seal ring of the invention.

Further, if the seal ring is formed of a conductive material as described in the embodiment, it is desirable to set a floating state without electric connection in order to block the outside air entry passage completely; however, it can also be used as a contact electrode, a power line, or the like.

In addition, the material of which the seal ring is formed is not limited to a conductive material and may be an insulating material. For example, the inner wall of the seal groove is coated with a silicon nitride film and polysilicon, silicon oxide, or the like may be filled in the seal groove. Further, to form a plurality of seal rings, the outermost periphery is formed of a hygroscopic material and the inside is formed of a dense film resistant to moisture, whereby if water enters the chip, it is absorbed in the hygroscopic material; it is made possible to prevent water from entering the inside.

What is claimed is:

1. A semiconductor device of a chip size package structure, the chip size package structure having a size substantially equal to a size of one surface of a semiconductor substrate, the one surface of the semiconductor substrate being covered with a resin, comprising:
    a seal ring surrounding an IC circuit formation part formed on a main face of the semiconductor substrate, said seal ring being placed between the IC circuit formation part and made up of seal grooves formed in interlayer insulation films of at least two layers and having seal material filled in the seal grooves; and
    a dicing line part formed surrounding the IC circuit formation part.

2. The semiconductor device as claimed in claim 1 wherein said seal ring is formed so as to cover outer peripheral ends of interlayer insulation films of at least two layers.

3. The semiconductor device as claimed in claim 1 wherein said seal ring is made up of plurality of rings arranged along a periphery of the semiconductor substrate.

4. The semiconductor device as claimed in claim 1 wherein said seal ring is made up of a first layer ring and a second layer ring deposited on the first layer ring.

5. The semiconductor device as claimed in claim 4 wherein a pad formed so as to cover cross sections of the first layer ring, and the second layer ring is placed between the first layer ring and the second layer ring.

6. The semiconductor device as claimed in claim 5 wherein the first layer ring, the second layer ring, and the pad are formed of metal material.

7. The semiconductor device as claimed in claim 5 wherein the first layer ring, the second layer ring, and the pad are formed at the same step as the IC circuit formation part.

8. The semiconductor device as claimed in claim 1 wherein the seal material is metal barrier layers formed so as to cover inner walls of the seal grooves and metal layers filled in the metal barrier layers.

9. The semiconductor device as claimed in claim 8 wherein the metal barrier layers are made of Ti or TiN and the metal layers are made of tungsten or copper.

10. The semiconductor device as claimed in claim 2 wherein the seal material contains a hygroscopic material.

11. The semiconductor device as claimed in claim 1 wherein the seal material is an insulating material.

12. The semiconductor device as claimed in claim 1 wherein the seal material is a silicon nitride film formed so as to cover the inner walls of the seal grooves and a silicon oxide film filled in the seal grooves coated with the silicon nitride film.

13. The semiconductor device as claimed in claim 1 wherein the dicing line part has a first dicing flank covering an upper flank of a semiconductor chip with the resin and a second dicing flank to which a lower flank of the semiconductor chip is exposed.

14. The semiconductor device as claimed in claim 13 wherein an interface between the first dicing flank and the second dicing flank is formed so as to become a predetermined depth position from the surface level of the semiconductor substrate.

15. The semiconductor device as claimed in claim 1 further including a spacer formed so as to surround said seal ring and coveran end part of an interface between an interlayer insulating film and another layer at the dicing line part.

16. The semiconductor device as claimed in claim 15 wherein the spacer is placed away from said seal ring.

17. A semiconductor device having a size substantially equal to a size of one surface of a semiconductor substrate, the one surface of the semiconductor substrate being covered with a resin, comprising:

a spacer formed so as to surround an IC circuit formation part formed on a main face of the semiconductor substrate and cover an end part of an interface between an interlayer insulating film and another layer at a dicing line part; and wherein the dicing line part has a first dicing flank covering an upper flank of the semiconductor substrate and a second dicing flank to which a lower flank of the semiconductor substrate is exposed.

18. The semiconductor device as claimed in claim 17 wherein an interface between the first dicing flank and the second dicing flank is formed so as to become a predetermined position from the surface level of the semiconductor substrate.

19. A semiconductor device of a chip size package structure, the chip size package structure having a size substantially equal to a size of one surface of a semiconductor substrate, the one surface of the semiconductor substrate being covered with a resin, comprising:

a seal ring surrounding an IC circuit formation part formed on a main face of the semiconductor substrate, said seal ring being placed between the IC circuit formation part; and a dicing line part formed surrounding the IC circuit formation part;

wherein the dicing line part has a first dicing flank covering an upper flank of the semiconductor chip with the resin and a second dicing flank to which a lower flank of the semiconductor chip is exposed; and wherein an interface between the first dicing flank and the second dicing flank is formed so as to become a predetermined depth position from the surface level of the semiconductor substrate.

* * * * *